United States Patent
Oh et al.

(10) Patent No.: US 11,616,077 B2
(45) Date of Patent: *Mar. 28, 2023

(54) 3D NAND MEMORY DEVICE AND METHOD OF FORMING THE SAME

(71) Applicant: Yangtze Memory Technologies Co., Ltd., Hubei (CN)

(72) Inventors: Jin Yong Oh, Wuhan (CN); Youn Cheul Kim, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/365,684

(22) Filed: Jul. 1, 2021

(65) Prior Publication Data

US 2021/0327900 A1  Oct. 21, 2021

Related U.S. Application Data

(63) Continuation of application No. 16/712,210, filed on Dec. 12, 2019, now Pat. No. 11,088,166, which is a
(Continued)

(51) Int. Cl.
*H01L 21/44* (2006.01)
*H01L 29/40* (2006.01)
(Continued)

(52) U.S. Cl.
CPC .. *H01L 27/11582* (2013.01); *H01L 21/31144* (2013.01); *H01L 27/1157* (2013.01); *H01L 27/11524* (2013.01); *H01L 27/11529* (2013.01)

(58) Field of Classification Search
CPC ......... H01L 27/11524; H01L 27/11529; H01L 27/1157
(Continued)

(56) References Cited

U.S. PATENT DOCUMENTS

| 7,772,632 B2 | 8/2010 | Haller et al. |
| 8,394,699 B2 | 3/2013 | Haller et al. |

(Continued)

FOREIGN PATENT DOCUMENTS

| CN | 101506966 A | 8/2009 |
| CN | 102064195 A | 5/2011 |

(Continued)

OTHER PUBLICATIONS

International Search Report and Written Opinion of the International Searching Authority dated Mar. 10, 2020, in PCT/CN2019/093179, 9 pages.

(Continued)

*Primary Examiner* — Calvin Lee
(74) *Attorney, Agent, or Firm* — Oblon, McClelland, Maier & Neustadt, L.L.P.

(57) ABSTRACT

A semiconductor device includes a first substrate having a first side for forming memory cells and an opposing second side, a doped region formed in the first side of the first substrate, a first connection structure formed over the second side of the first substrate and coupled to the doped region through a first VIA, and a transistor formed in a first side of a second substrate and coupled to the first connection structure. The first VIA extends from the second side of the first substrate to the doped region. The memory cells include a plurality of word lines formed over the first side of the first substrate, a plurality of insulating layers disposed between the plurality of word lines, and a common source structure coupled to and extending from the doped region, and further extending through the plurality of word lines and the plurality of the insulating layers.

16 Claims, 13 Drawing Sheets

Related U.S. Application Data continuation of application No. PCT/CN2019/093179, filed on Jun. 27, 2019.

(51) Int. Cl.
  *H01L 27/11582* (2017.01)
  *H01L 21/311* (2006.01)
  *H01L 27/11524* (2017.01)
  *H01L 27/11529* (2017.01)
  *H01L 27/1157* (2017.01)

(58) Field of Classification Search
  USPC ............. 257/341, 401, 774–776; 438/140, 438/667–675
  See application file for complete search history.

(56) References Cited

U.S. PATENT DOCUMENTS

| | | | |
|---|---|---|---|
| 9,299,392 | B2 | 3/2016 | Lee et al. |
| 10,176,880 | B1 | 1/2019 | Lee et al. |
| 10,283,452 | B2 * | 5/2019 | Zhu .................. H01L 27/11529 |
| 10,304,852 | B1 | 5/2019 | Cui et al. |
| 10,770,468 | B2 * | 9/2020 | Wang .................. H01L 23/5226 |
| 11,031,377 | B2 * | 6/2021 | Liu .......................... H01L 24/32 |
| 11,088,166 | B2 * | 8/2021 | Oh ....................... H01L 27/1157 |
| 2008/0042179 | A1 | 2/2008 | Haller et al. |
| 2009/0090950 | A1 | 4/2009 | Forbes et al. |
| 2010/0273303 | A1 | 10/2010 | Haller et al. |
| 2011/0115018 | A1 | 5/2011 | McGregor |
| 2014/0126265 | A1 | 5/2014 | Lee et al. |
| 2017/0103994 | A1 | 4/2017 | Fukuzumi et al. |
| 2018/0277517 | A1 | 9/2018 | Kim et al. |
| 2018/0366486 | A1 | 12/2018 | Hada et al. |
| 2019/0006013 | A1 | 1/2019 | Lee et al. |
| 2019/0013326 | A1 | 1/2019 | Hua |
| 2019/0081069 | A1 | 3/2019 | Lu et al. |
| 2019/0139973 | A1 | 5/2019 | Zhou et al. |
| 2019/0312051 | A1 | 10/2019 | Park et al. |
| 2019/0355740 | A1 | 11/2019 | Hong et al. |
| 2020/0328186 | A1 | 10/2020 | Liu |

FOREIGN PATENT DOCUMENTS

| | | |
|---|---|---|
| CN | 103811494 A | 5/2014 |
| CN | 109119426 A | 1/2019 |
| CN | 109215694 A | 1/2019 |
| CN | 109755254 A | 5/2019 |
| CN | 109841630 A | 6/2019 |
| CN | 109860197 A | 6/2019 |
| CN | 109887920 A | 6/2019 |
| JP | 8-186235 | 7/1996 |
| JP | 8-227980 | 9/1996 |
| JP | 2018-182320 A | 11/2018 |
| KR | 10-2012-004841 5 | 5/2012 |
| KR | 10-2017-0014757 | 2/2017 |
| KR | 10-2017-0083948 | 7/2017 |
| TW | 201824518 A | 7/2018 |
| TW | 201913976 A | 4/2019 |
| TW | 201924027 A | 6/2019 |
| WO | WO2020/211332 A1 | 10/2020 |

OTHER PUBLICATIONS

Combined Chinese Office Action and Search Report dated Jun. 30, 2020 in Chinese Patent Application No. 201980001306.X (with English translation of Category of Cited Documents), 8 pages.

Combined Office Action and Search Report dated Jan. 10, 2020 in Chinese Patent Application No. 201980001306.X, 7 pages (with English translation of categories of cited documents).

European Extended Search Report dated Oct. 20, 2022 in European Application No. 19935559.5, 11 pgs.

Korean Office Action dated Octooer 19, 2022 in Korean Application No. 10-202)-7038759, 7 pgs.

Japanese Office Action dated Oct. 17, 2022 in Japanese Application No. 2021-546332, 9 pgs.

Japanese Office Action dated Nov. 7, 2022. in Japanese Application No. 2021-559590, 6 pgs.

Korean Office Action dated Oct. 5, 2022 in Korean Application No. 10-2021-7002103, 12 pgs.

* cited by examiner

3D NAND MEMORY DEVICE AND METHOD OF FORMING THE SAME

RELATED APPLICATION

This application is a continuation of U.S. patent application Ser. No. 16/712,210 filed on Dec. 12, 2019, now U.S. Pat. No. 11,088,166 issued on Aug. 10, 2021, which is a bypass continuation of International Application No. PCT/CN2019/093179, filed on Jun. 27, 2019. The entire contents of the above-identified applications are incorporated herein by reference in their entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit.

A 3D-NAND memory device is an exemplary device of stacking multiple planes of memory cells to achieve greater storage capacity, and to achieve lower costs per bit. In a related 3D NAND architecture, periphery circuits take up about 20-30% of die area, which lowers NAND bit density. As 3D NAND technology continues to progress to 128 layers and above, the periphery circuits will likely take up more than 50% of the total die area.

In a cross-stacking structure, the periphery circuits which handle data I/O as well as memory cell operations are processed on a separate wafer (CMOS wafer) using a logic technology node (i.e., 14 nm, 7 nm) that enables the desired I/O speed and functions. Once the processing of a cell array wafer is completed, the two wafers are connected electrically through millions of metal vertical interconnect accesses (VIAs) that are formed simultaneously across the whole wafer in one process step. By using the innovative cross-stacking structure, the periphery circuits are now above cell array chip formed in the cell array wafer, which enables much higher NAND bit density than related 3D NAND with limited increase in total cost.

SUMMARY

The inventive concepts relate to formation of a 3D NAND memory device with a cross-stacking structure and a method of forming a top contact and a bottom contact to couple to a n-well region respectively so as to reduce the contact to n-well region resistance.

A related 3D-NAND memory device can include two or more n-well regions formed in a top region of a substrate, and two or more array common source (ACS) structures that are formed over the two or more n-well regions. Each of the two or more ACS structures is in contact with a respective n-well region. The related 3D-NAND memory device can also have a plurality of M1 routing lines. The M1 routing lines are electrically coupled to the ACS structures through a plurality of M1 VIAs. A plurality of source lines are positioned over the plurality of M2 routing lines. The source lines are electrically coupled to the M1 routing lines through a plurality of M2 VIAs.

In the related 3D-NAND memory device, an input voltage is applied to the n-well regions through a conductive channel that is formed by the source lines, the M2 VIAs, the M1 routing lines, the M1 VIAs, and the ACS structures. The ACS structures typically are wall-shaped line contacts along a word line (WL) direction of the 3D-NAND memory device. Such a wall-shaped contact needs sufficient conductivity to prevent a ground noise from arising in sensing operations. The ACS structures can be formed with tungsten, polysilicon, or tungsten plus polysilicon because tungsten, polysilicon, or tungsten plus polysilicon are appropriate materials to conformally fill deep and wide contact trenches with minimal voids. Despite of process friendly characteristics, tungsten and polysilicon have relatively high resistivity compared to other contact metals, such as Cu or Al. As a height of 3D NAND stacks increases with its memory density, a height of the ACS structures accordingly grows. A resistance of the ACS structures inevitably surges in a height direction of the 3D NAND stacks. To reduce such resistance increase along the height escalation, a width of the ACS regions should get proportionally larger, which in turn impacts a die size and wafer mechanical stability due to high tungsten stress.

In the present disclosure, a cross-stacking structure is applied to form a 3D-NAND memory device. In the cross-stacking structure, a plurality of transistors are formed over the top surface of a CMOS substrate (or periphery circuit substrate), and a memory cell stack is formed over the top surface of a cell array substrate. The CMOS substrate is bonded through bonding VIAs with the cell array substrate. Here, the top surface of the CMOS substrate and the top surface of the cell array substrate are aligned facing each other.

In the disclosed 3D-NAND memory device, two or more n-well regions extend in the cell array substrate from the top surface of the cell array substrate. A plurality of bottom source lines are formed over a bottom surface of the cell array wafer. The bottom source lines are coupled to the n-well regions through a plurality of VIA contacts. The VIA contacts are formed to extend from the bottom surface of the cell array wafer to reach the n-well regions. In addition, the n-well regions are coupled to a plurality of top source lines through a conductive channel that is formed by two or more ACS structures formed over and coupled to the n-well regions, a plurality of M1 routing lines formed over and coupled to the ACS structures, and a plurality of top source lines formed over and coupled to the M1 routing lines.

By introducing such a cross-point structure mentioned above, the bottom source lines (or bottom source line mesh) can be electrically coupled to n-well regions from a polished backside (i.e., the bottom surface) of the cell array substrate. Accordingly, a resistance of source lines to n-well regions can be decreased. Comparing to the related 3D-NAND memory device, where the n-well regions is coupled to the source line mesh (or source lines) through the conductive channel that is formed by the source lines, the M2 VIAs, the M1 routing lines, the M1 VIAs, and the ACS structures, the present disclosure can have direct connection from source lines to n-well regions through VIA contacts made of conductive metal, such as Cu. In contrast to the related examples, the present disclosure can provide several advantages. For example, the decreased resistance of source lines to n-well regions reduces ground noise that is a undesired voltage increase in the n-well regions. Also, the resistance of the ACS structures does not impact a source side resistance of the memory device and the ground noise. Further, the disclosed structure can eliminate gaps between M1 routing lines that are used to add contacts to connect source line mesh and ACS structures in the related examples, which in turn helps die size reduction in a word line direction.

According to an aspect of the present disclosure, a semiconductor device architecture is provided as follows. The semiconductor device can include a first substrate that has a first side for forming memory cells and a second side that is opposite to the first side. The semiconductor device also includes a doped region and a first connection structure (also referred to as a first source line mesh). The doped region is formed in the first side of the first substrate and is electrically coupled to at least a source terminal of a transistor (e.g., a source terminal of an end transistor of multiple transistors that are connected in series). The first connection structure is formed over the second side of the first substrate and coupled to the doped region through a first VIA. The first VIA extends from the second side of the first substrate to the doped region.

In some embodiments, the semiconductor device can further include a common source structure (also referred to as array common source structure) formed over and coupled to the doped region, a bit line formed over the common source structure that is coupled to the common source structure through a second VIA, and a second connection structure (also referred to as a second source line mesh) positioned over the bit line that is coupled to the bit line through a third VIA. The first connection structure and the second connection structure are coupled to each other.

In some embodiments, a transistor is formed in a first side of a second substrate and a bonding VIA formed over and coupled to the transistor. In addition, the first side of the first substrate and the first side of the second substrates are aligned facing each other so that the transistor is coupled to the second connection structure through the bonding VIA.

The semiconductor device can further include a fourth VIA that is formed over the second connection structure and connected to the bonding VIA. The first substrate and the second substrate are bonded each other through the fourth VIA and the bonding VIA.

In some embodiments, the first VIA extends through the doped region and is in contact with the common source structure. The semiconductor device can include a spacer layer disposed between the first VIA and the first substrate so that isolates the first VIA from the first substrate.

Additionally, a highly doped n+ region can be arranged between the first VIA and the doped region, and the doped region is n-type. The first VIA can have at least one of an extended wall-shape that has a tapered cross section or a frustoconical shape.

In some embodiments, the semiconductor device further includes a plurality of channel structures extending from the first side of the first substrate, and a plurality of word lines positioned over the first side of the first substrate in a staircase configuration. The plurality of the word lines are spaced apart from each other by a plurality of insulating layers. The channel structures extend through the plurality of word lines and the plurality of the insulating layers. The plurality of channel structures are disposed below the bit line, and the common source structure extends through the plurality of word lines and the plurality of insulating layers and separates the plurality of the channel structures.

According to another aspect of the present disclosure, a method for manufacturing a semiconductor device is disclosed. In the disclosed method, a first VIA that extends from a second side of the first substrate is formed. The first substrate has an opposing first side on which a memory stack is formed. The memory stack includes a doped region positioned in the first side of the first substrate. The doped region is electrically coupled to at least a source terminal of a transistor (e.g., a source terminal of an end transistor of multiple transistors that are connected in series) and the first VIA is in direct contact with the doped region. Further, a first connection structure is formed over the first VIA so that the first connection structure is coupled to the doped region through the first VIA.

In some embodiments, in the disclosed method, a portion of first substrate is removed from the second side of the first substrate. The first VIA is subsequently formed. The first VIA extends from the second side of the first substrate to the doped region. Further, the first connection structure is formed over the first VIA.

Additionally, a common source structure can be formed over and coupled to the doped region. A bit line is formed over the common source structure, and the bit line is coupled to the common source structure through a second VIA. Moreover, a second connection structure is formed over the bit line. The second connection structure is coupled to the bit line through a third VIA. The first connection structure and the second connection structure are coupled to each other.

In the disclosed method, a transistor is formed over a first side of a second substrate. A bonding VIA is formed over the transistor. The bonding VIA is electrically coupled to the transistor. Further, the first substrate and the second substrate are bonded through the bonding VIA, where the second connection structure is aligned with the transistor, and coupled to the transistor through the bonding VIA.

In some embodiments, a Through Silicon Via (TSV) is formed that extends from the second side of the first substrate to the first side of the first substrate. The first connection structure and the second connection structure are electrically connected through the TSV. In some embodiments, a n+ region is formed between the first VIA and the doped region, and the doped region is n-type.

According to yet another aspect of the disclosure, a 3D-NAND memory can be provided. The 3D-NAND memory includes a transistor formed in a first side of a periphery circuit substrate, a memory cell stack formed over a first side of a cell array substrate, and a first connection structure formed over an opposing second side of the cell array substrate. The memory cell stack further includes a doped region formed in the first side of the cell array substrate. The doped region is coupled to the first connection structure through the first VIA that extends from the second side of the cell array substrate to the doped region. The memory cell stack also includes a common source structure that extends from the doped region toward the first side of the periphery circuit substrate and is coupled to the doped region. In the memory cell, a bit line is positioned between the common source structure and a second connection structure. The bit line is coupled to the common source structure through a second VIA. The second connection structure is coupled to the bit line through a third VIA, and the first side of the cell array substrate and the first side of a periphery circuit substrate are aligned facing each other so that the transistor is coupled to the second connection structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
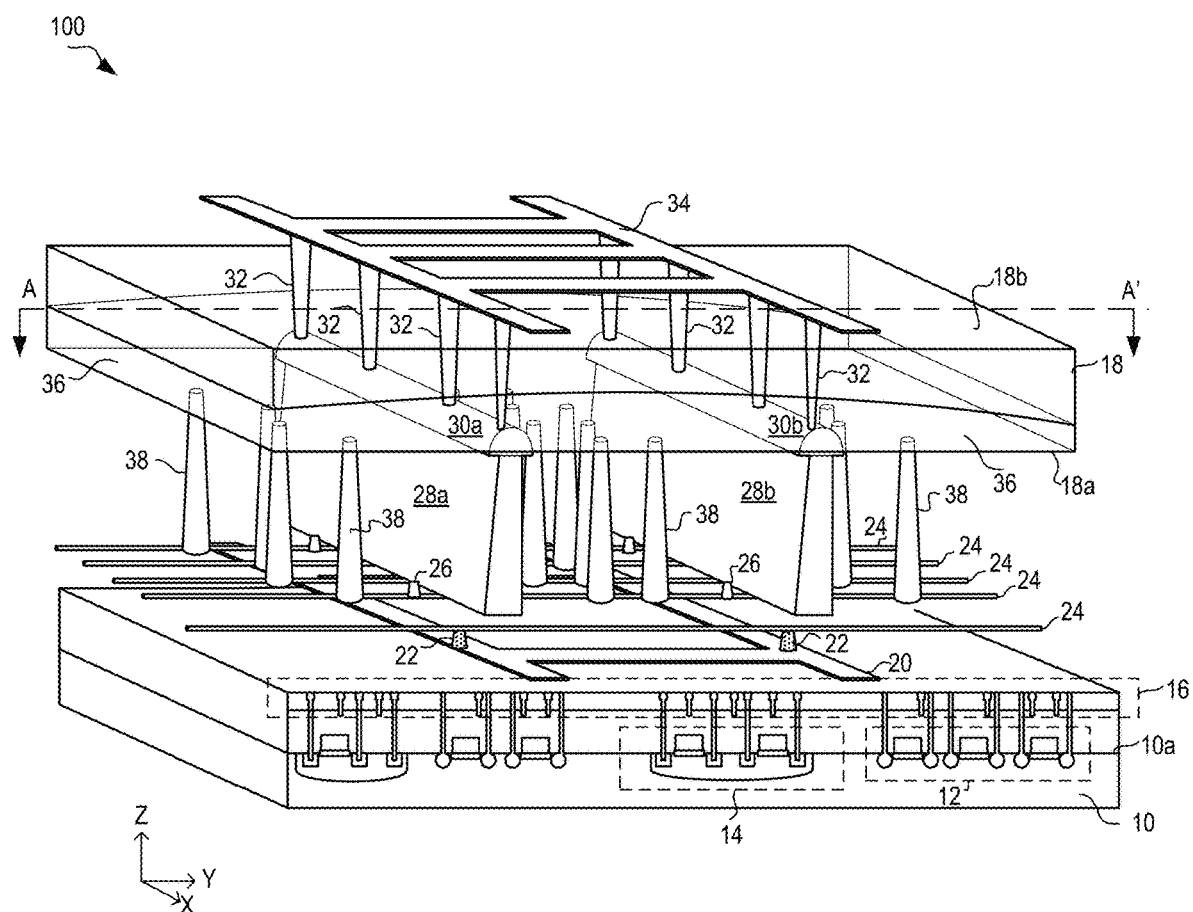
FIG. 1A is a schematic perspective view of a 3D-NAND memory device in three-dimensions, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are in direct contact with each other, and may also include embodiments in which additional features are disposed formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
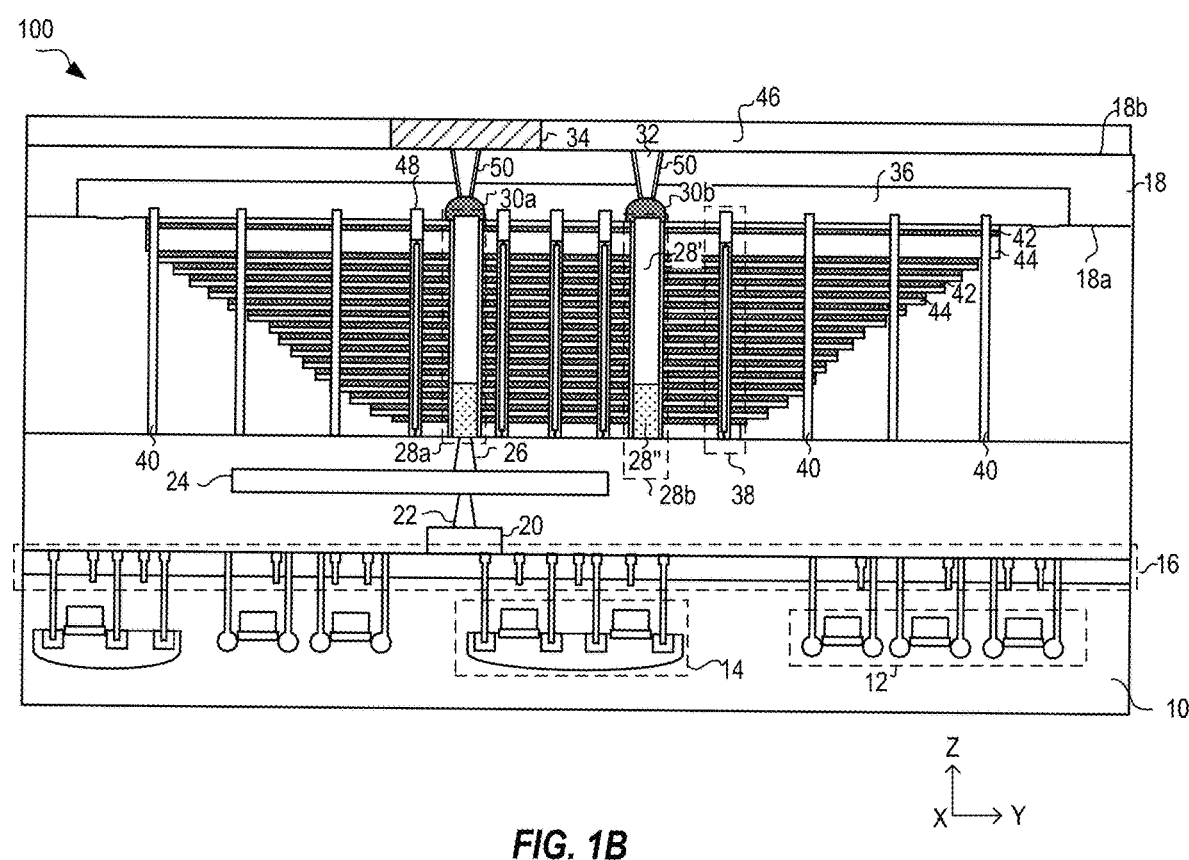
FIG. 1B is a cross-sectional view of a 3D-NAND memory device, in accordance with exemplary embodiments of the disclosure.

FIG. 1A is a perspective view of a 3D-NAND memory device 100 and FIG. 1B is a cross-sectional view of the 3D-NAND memory device 100. The cross-sectional view of the 3D-NAND memory device 100 in FIG. 1B is obtained from a line A-A' along a Y-direction (i.e., bit line direction) of the memory device 100 in FIG. 1A.

As shown in FIG. 1A, the memory device 100 can have a first substrate 10 that is suitable for complementary metal-oxide-semiconductor (CMOS) technology, and is referred to as CMOS substrate 10 or periphery circuit substrate 10. Circuits in the CMOS technology are formed using p-type MOS (PMOS) transistors and n-type MOS (NMOS) transistors. In some examples, the PMOS transistors and NMOS transistors are collectively referred to as CMOS transistors. A plurality of CMOS transistors are formed over a top surface 10a of the CMOS substrate 10. The CMOS transistors can form electric circuits to handle data I/O as well as memory cell operations of the memory device 100. For example, as shown in FIG. 1A, a plurality of NMOS transistors 12 and a plurality of PMOS transistors 14 are formed on a top portion of the CMOS substrate 10.

Further, a plurality of bonding VIAs 16 are formed over the CMOS transistors and electrically coupled to the CMOS transistors. For example, the bonding VIAs 16 can be electrically connected to gates, source regions, or drain regions of the CMOS transistors.

The memory device 100 further includes a second substrate 18 that is suitable for memory cells and is referred to as cell array substrate 18. A memory cell stack can be formed over a top surface 18a of the cell array substrate 18, and a plurality of bottom source lines 34 can be formed over an opposing bottom surface 18b of the cell array substrate 18. In some examples, the bottom source lines 34 are connected to form a bottom source line mesh, and the bottom source line mesh can also be referred to as a bottom connection structure. The memory cell stack includes two or more n-well regions 30 (shown as 30a and 30b in FIG. 1A) that extend into the cell array substrate 18 from the top surface 18a. The n-well regions 30 are coupled to the bottom source lines 34 through a plurality of first VIAs 32 that extends from the bottom surface 18b of the cell array substrate 18 to the n-well regions 30. Two or more array common source (ACS) structures 28 that extend from the n-well regions 30 toward the top surface 10a of the CMOS substrate 10 and are coupled to the n-well regions 30. Each of the two or more n-well regions 30 can be in direct contact with a respective ACS structure.

A plurality of M1 routing lines 24 are positioned between the ACS structures 28 and a plurality of top source lines 20. In some examples, the top source lines 20 are connected to form a top source line mesh, and the top source line mesh can also be referred to as a top connection structure. The M1 routing lines 24 are coupled to the ACS regions 28 through a plurality of second VIAs 26. For example, as shown in FIG. 1B, an ACS structure 28a can connect to a M1 routing line 24 through a second VIA 26. It should be mentioned that the M1 routing lines include a plurality of bit lines that are coupled to a plurality of channel structures 38. The channel structures 38 are illustrated in FIG. 1B.

The top source lines 20 are formed over the M1 routing lines 24 and coupled to the M1 routing lines through a plurality of third VIAs 22. For example, as shown in FIG. 1B, a top source line 20 is electrically connected to a M1 routing line 24 through a third VIA 22. In the disclosed memory device 100, the top surface 18a of the cell array substrate 18 and the top surface 10a of the CMOS substrate 10 are aligned facing each other so that the transistors are coupled to the top source lines 20 through the bonding VIAs 16. As shown in FIG. 1B, a source line 20 is electrically connected to a PMOS transistor 14 through a bonding VIA 16.

The cell array substrate 18 can include a p-well region 36 that is formed in a top region of the cell array substrate 18, where the n-well regions 30 can be positioned in the p-well region 36. The p-well region 36 can extend into the cell array substrate 18 from the top surface 18a with a depth from 0.5 um to 5 um according to the design requirements. The p-well is also known as 'active tub' since voltages are applied to the tub during erasing or programming the memory device 100. The p-well can be also configured to isolate the memory cell stack from adjacent components.

As shown in FIG. 1B, a top source line 20 is electrically coupled to one or more CMOS transistors, such as one of the PMOS transistors 14, through one or more bonding VIAs 16. An M1 routing line 24 is electrically coupled to the top source line 20 through a third VIA 22. The ACS structure 28a is electrically coupled to M1 routing line 24 through a second VIAs 26. An n-well region 30a is in contact with an ACS structures 28a. The n-well regions 30 further extend into the cell array substrate 18 from the top surface 18a. The first VIAs 32 extend into the cell array substrate 18 from the bottom surface 18b to the n-well regions 30. The bottom source lines 34 are formed over the first VIAs 32 and in direct contact with the first VIAs 32.

As shown in FIG. 1B, the memory device 100 also includes the plurality of channel structures 38. The channel structures 38 protrude from the top surface 18a of the cell array substrate 18 along a height direction (Z-direction) that are perpendicular to the cell array substrate 18. In the memory device 100, a plurality of word lines 42 are positioned over the top surface 18a of the cell array substrate 18 with a staircase configuration, and are spaced apart from each other by a plurality of insulating layers 44. The channel structures 38 extend through the plurality of word lines 42 and the plurality of the insulation layers 44. The channel structures 38 are electrically coupled to M1 routing lines 24 through top channel contacts (not shown). In the FIG. 1B example, the M1 routing lines 24 that are connected to the channel structures 38 are configured as bit lines for the memory cell array, and can be referred to as bit lines 24. The M1 routing lines 24 extend in a length direction (Y-direction) of the cell array substrate 18. The ACS structures 28 extend through the plurality of word lines 42 and the plurality of insulating layers 44 along the height direction, and further extend in a width direction (X-direction) of the cell array substrate 18. The plurality of the channel structures 38 are separated by the ACS regions 28.

In some embodiments, the memory device 100 also includes a plurality of dummy channel structures 40. The dummy channel structures 40 protrude from the top surface 18a of the cell array substrate 18 along the height direction of the cell array substrate 18. Some of the dummy channel structures 40 can further extend through the word lines 42 and insulating layers 44.

In some embodiments, the ACS structures 28 can have a top portion 28' that is made of tungsten, and a bottom portion 28'' that is made of polysilicon. The channel structures 38 can have a cylindrical shape with sidewalls and a bottom region. Of course, other shapes are possible. The channel structures 38 are formed along the height direction of the cell array substrate 18, and electrically coupled with the cell array substrate 18 VIA bottom channel contacts 48 of the channel structures 38. Each of the channel structures 38 further includes a respective channel layer, a respective tunneling layer, a respective charge trapping layer, and a respective barrier layer. For simplicity and clarity, the channel layer, tunneling layer, charge trapping layer, and barrier layer are not shown in FIG. 1B.

In some embodiments, the top source lines 20 and the bottom source lines 34 are electrically connected through one or more through silicon VIAs (TSVs) that are not shown in FIGS. 1A and 1B.

In some embodiments, a plurality of spacer layers 50 are formed between the first VIAs 32 and the cell array substrate 18 in order to isolates the first VIAs 32 from the cell array substrate 18. The spacer layers 50 can be a dielectric layer, such as a Tetraethyl orthosilicate (TEOS) layer. The first VIAs 32 can have an extended wall-shape that has a tapered cross section, a frustoconical shape, or other suitable shapes.

In some embodiments, a plurality of fourth VIAs (not shown) can be formed over the top source lines 20. The fourth VIAs can be bonded with the bonding VIAs 16 subsequently so that the top source lines 20 are coupled to the transistors through the bonded fourth and bonding VIAs.

In some embodiments, a plurality of n+ regions (not shown) can be arranged between the first VIAs 32 and the n-well regions 30 to improve conductivity between the first VIAs 32 and the n-well regions 30. Each of the n+ regions can be disposed between a respective first VIA and a respective n-well region 30. The n-well regions 30 can be doped through an ion implantation process with phosphorus at a dopant concentration from 10e11 cm$^{-3}$ to 10e14 cm$^{-3}$. The N+ regions can be doped with phosphorus at a dopant concentration from 10e14 cm$^{-3}$ to 10e18 cm$^{-3}$.

In some embodiments, a dielectric layer 46 can be formed over the bottom surface 18b of the cell array wafer 18, and the bottom source lines 34 are formed in the dielectric layer 46. Further, an insulating layer (not shown) can be disposed between the bottom surface 18b of the cell array wafer 18 and the bottom source lines 34 so that the bottom source lines 34 are spaced apart from the cell array 18. Accordingly, the second VIAs 32 can extend through the insulating layer, and further extend into the cell array wafer 18 from the bottom surface 18b.

The first VIAs 32 can be made of Cu, W, Ru, or other suitable material. In some embodiments, a barrier layer can be disposed between the first VIAs 32 and the spacer layers 50. The barrier layer can be made of Ta, TaN, Ti, TiN, or other suitable materials. The top source lines 20 and the bottom source lines 34 can be made of Cu, Al, W, or other suitable materials.

It should be mentioned that FIGS. 1A and 1B are merely exemplary embodiments of the disclosed 3D-NAND memory device 100. The 3D-NAND memory device can include other components, structures, and dimensions according to different design requirements.

Figure 2:
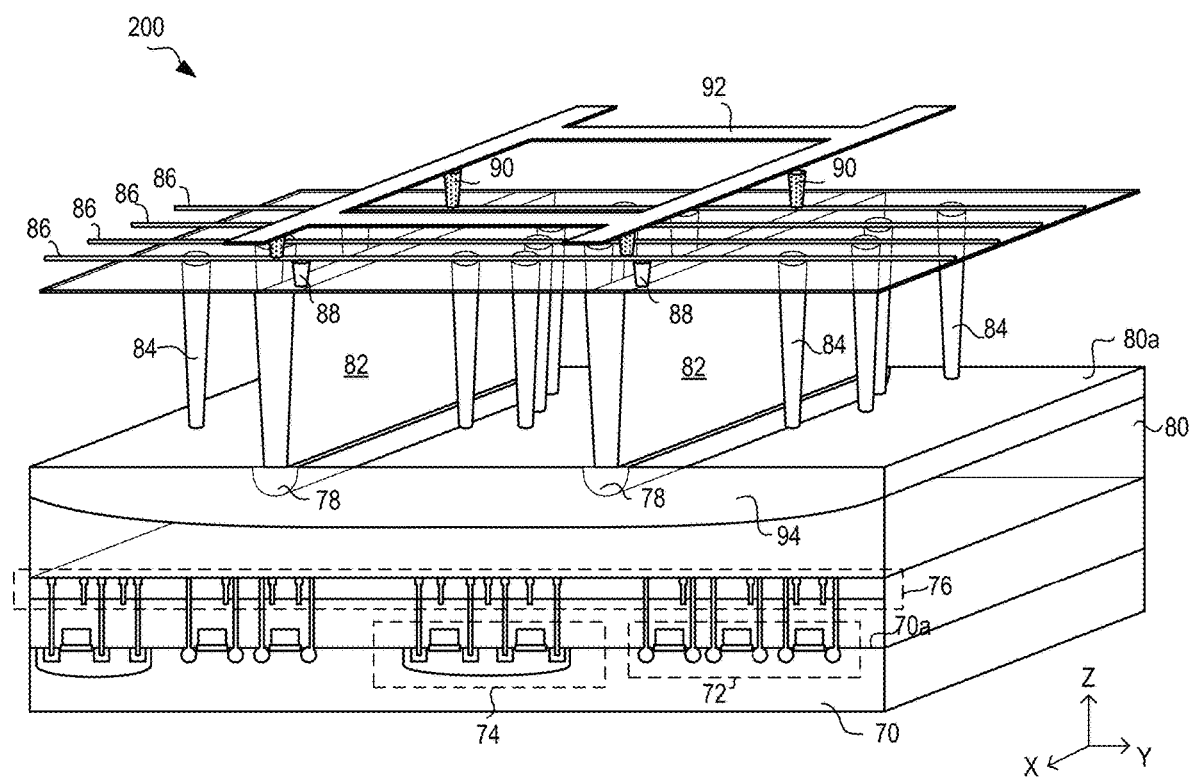
FIG. 2 is a schematic perspective view of a related 3D-NAND memory device in three-dimensions, in accordance with exemplary embodiments of the disclosure.

FIG. 2 is a schematic perspective view of a related 3D-NAND memory device 200 in three-dimensions, in accordance with exemplary embodiments of the disclosure. The memory device 200 has a CMOS substrate 70. A plurality of CMOS transistors are formed over a top surface 70a of the CMOS substrate 70. The CMOS transistors can include NMOS transistors 72 and PMOS transistors 74. A plurality of bonding VIAs 76 are formed over the CMOS transistors and electrically coupled to the CMOS transistors. The bonding VIAs 76 can be electrically connected to source regions, drain regions, or gates of the CMOS transistors.

A cell array substrate 80 is positioned over the bonding VIAs 76. Two or more n-well regions 78 are formed in the cell array substrate 80. The n-well regions 78 extend into the cell array substrate 80 from a top surface 80a. In the cell array substrate 80, a p-well region 94 is formed. The p-well region 94 is positioned in a top position of the cell array substrate 80. Over the n-well regions 78, two or more ACS structures 82 are formed. Each of the n-well regions 78 is in direct contact with a respective ACS structure 82. Over the ACS structures 82, a plurality of M1 VIAs 88 are formed. A plurality of M1 routing lines 86 are arranged over the ACS structures 82. The M1 routing lines 86 are coupled to the ACS structures 82 through the M1 VIAs 88.

In the memory device 200, a plurality of M2 VIAs 90 are formed over the M1 routing lines 86. Over the M2 VIAs 90, a plurality of source lines (or a source line mesh) 92 are formed. The source lines 92 are electrically coupled to the M1 routing lines 86 through the M2 VIAs 90. The memory device 200 further includes a plurality of channel regions 84. The channel regions 84 protrude from the top surface 80a and extend along of a height direction (Z-direction) of the cell array substrate 80. The channel structures 84 are positioned below the M1 routing lines 86 and electrically coupled to the M1 routing lines through top channel contacts (not shown). The M1 routing lines that are connected to the channel structures can be named as bit lines. Similar to the memory device 100, the memory device 200 further includes a plurality of word lines (not shown in FIG. 2) formed over the top surface 80a of the cell array substrate 80. The word lines are spaced apart from each other by a plurality of insulating layers (not shown in FIG. 2). The channel structures 84 extend through the word lines and the insulating layers. The ACS structures 82 also extend through the word lines and the insulating layers.

In some embodiments, the channel structures 84 and the n-well regions 78 can be electrically coupled to the CMOS transistors formed in the CMOS substrate 70 through the bonding VIAs 76.

In the related 3D-NAND memory device 200, an input voltage can be applied to the n-well regions 78 through a conductive channel that is formed by the source lines 92, the M2 VIAs 90, the M1 routing lines 86, the M1 VIAs 88, and the ACS structures 82. The ACS structures 82 typically are wall-shaped line contacts along a word line direction (X-direction) of the cell array substrate 80. Such a wall-shaped contact needs sufficient conductivity to prevent an arising ground noise during sensing operations. As the height of 3D NAND stacks increases with density, a height of the ACS structures also increases. The increased height of the ACS structures results in an increased resistance of the ACS structures. In order to reduce the amount of such resistance, a width of the ACS structures can be increased, which in turn impacts a die size and wafer mechanical stability due to high tungsten stress.

FIGS. 3A through 7 are perspective and cross-sectional views of various intermediary steps of manufacturing the 3D-NAND memory device 100, in accordance with exemplary embodiments of the disclosure.

Figure 3A:
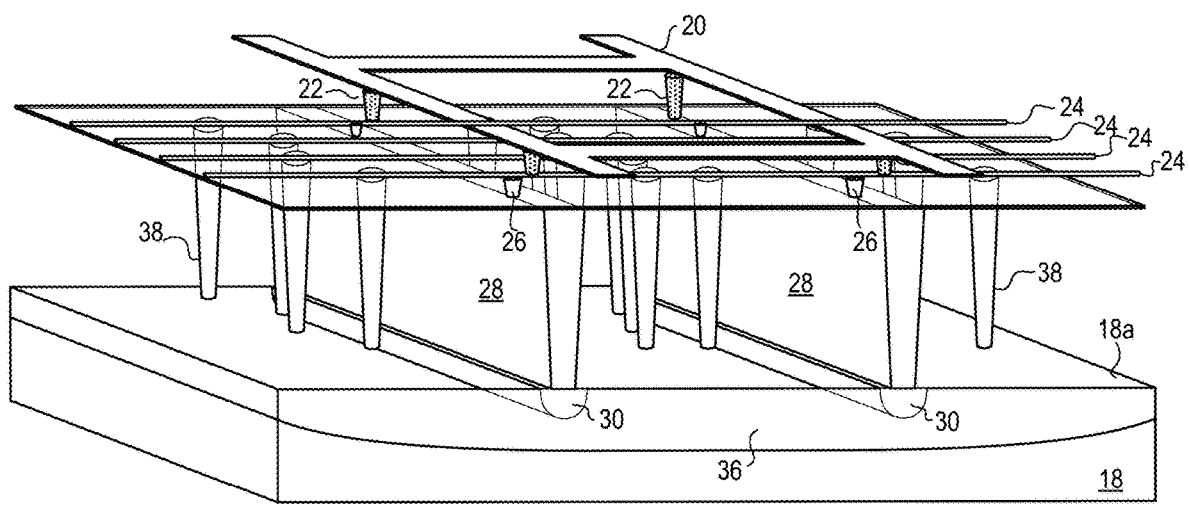
FIGS. 3A through 7 are perspective and cross-sectional views of various intermediate steps of manufacturing a 3D-NAND memory device, in accordance with exemplary embodiments of the disclosure.

FIG. 3A is a schematic perspective view of a memory cell stack that is formed over the cell array substrate 18. The memory cell stack can be formed through a variety of semiconductor manufacturing processes. The semiconductor manufacturing processes can include a photolithography process, a dry etching process, a wet etching process, a wet clean process, an implantation process, a film deposition process (i.e., CVD, PVD, diffusion, electroplating), a surface planarization process (i.e., CMP), and other suitable semiconductor manufacturing processes. As shown in FIG. 3A, the memory stack can have a similar configuration that is illustrated in FIG. 1A. For example, the memory stack can includes the n-well regions 30 that extend from the top surface 18a into the cell array substrate 18. The ACS structures 28 are formed over the n-well regions 30 and in contact with the n-well regions. The ACS regions 28 and the M1 routing lines 24 are electrically connected through the second VIAs 26. The top source lines (source line mesh) 20 are electrically connected to the M1 routing lines 24 through the third VIAs 22.

Figure 3B:
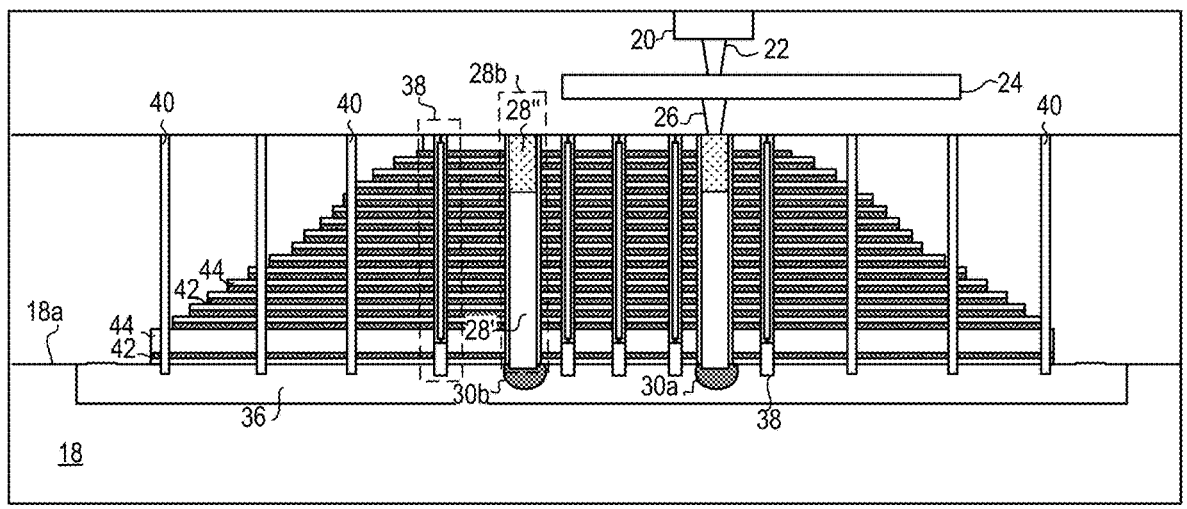

FIG. 3B is a cross-sectional view of the memory cell stack that has a similar configuration illustrated in FIG. 1B. The memory cells stack further includes the channel regions 38 and the dummy channel regions 40. The channel regions 38 and dummy channel regions 40 protrude from the top surface 18a and extend along of the height direction of the cell array substrate 18. The channel structures 38 are positioned below the M1 routing lines 24 and electrically coupled to the M1 routing lines 24 through the top channel contacts (not shown). The M1 routing lines that are connected to the channel structures can be named as bit lines. The memory cell stack further includes the word lines 42 formed over the top surface 18a of the cell array substrate 18. The word lines 42 are spaced apart from each other by the insulating layer 44. The channel structures 38 extend through the word lines 42 and the insulating layers 44. The ACS structures 28 also extend through the word lines 42 and the insulating layers 44.

Figure 4A:
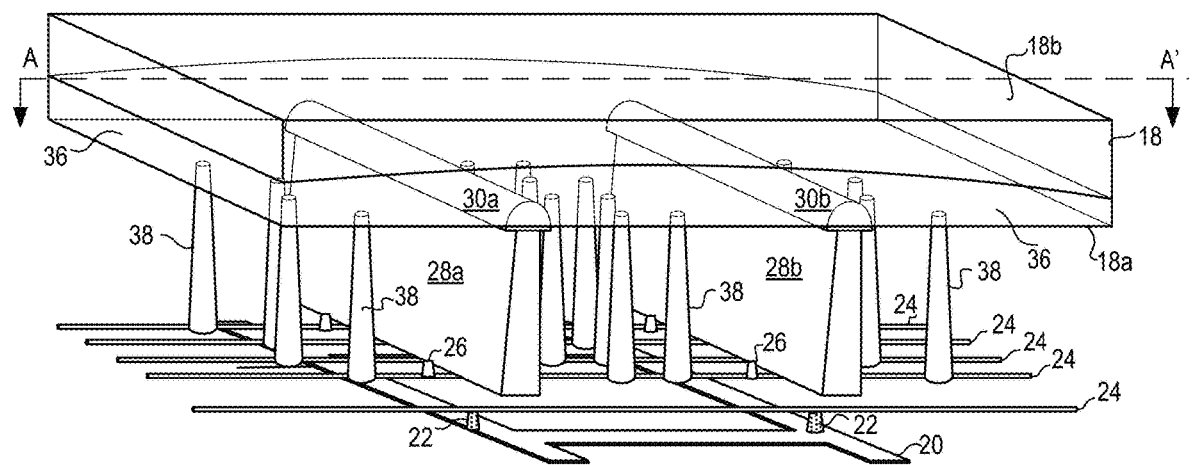
Figure 4B:
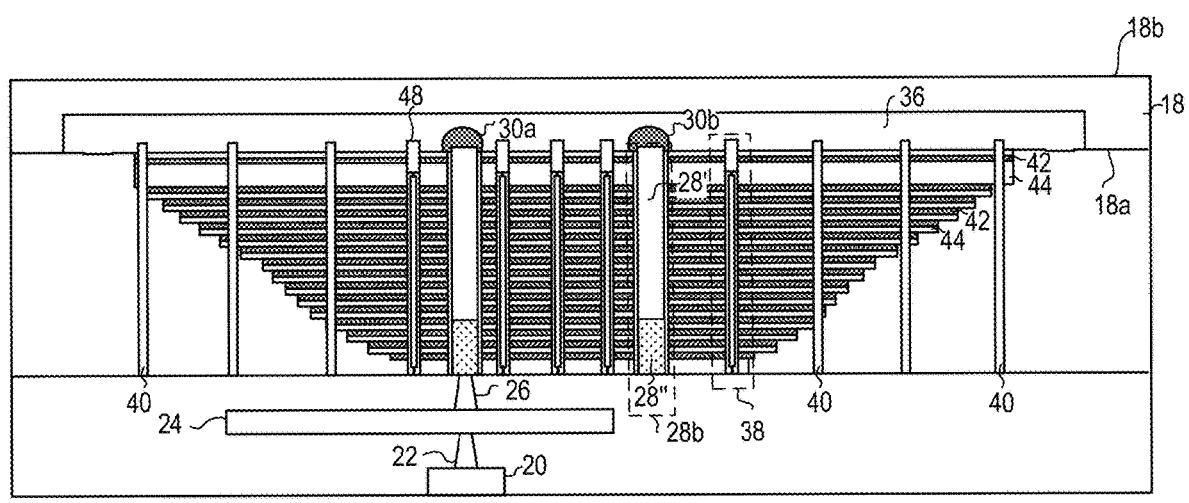

In FIGS. 4A and 4B, the memory cell stack can be flipped upside down and the bottom surface 18b of the cell array substrate 18 is exposed. A subsequent surface removal process, such as a CMP process, an etching process, or a combination thereof, can be applied to remove a portion of the cell array substrate 18 from the bottom surface 18b. After the surface removal process, the thickness of the cell array substrate 18 is reduced.

Figure 5A:
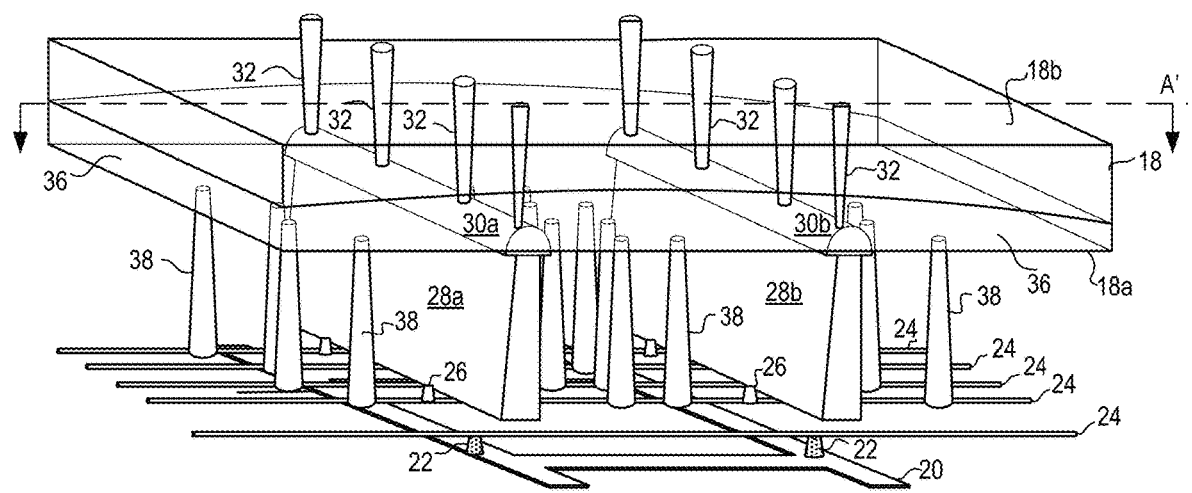
Figure 5B:
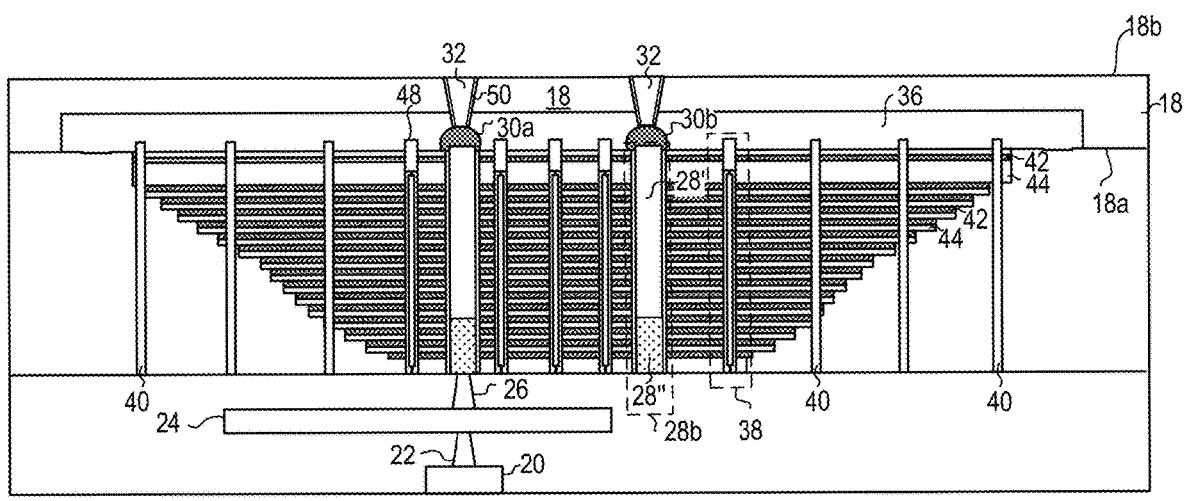

In FIGS. 5A and 5B, the plurality of first VIAs 33 can be formed through a variety of semiconductor manufacturing processes that include a photolithography process, an etching process, a film deposition process (i.e., CVD, electroplating), and a surface planarization process. For example, a patterned mask layer can be formed over the bottom surface 18b of the cell array substrate 18 through the photolithography process. A dry etching process can transfer patterns in the mask layer into the cell array substrate to form a plurality of VIA openings. Based on the film deposition process, a spacer layer 50 can be deposited in the VIA openings and a conductive layer (i.e., Cu) can be formed over the spacer layer 50 to fill the VIA openings through an electroplating process. A subsequent surface planarization process, such as CMP, can be applied to remove excessive Cu over the bottom surface of the cell array substrate.

The conductive layer that remains in the VIA openings become the first VIAs 32. The first VIAs 32 extend into the cell array substrate 18 from the bottom surface 18b and land on the n-well regions 30 so as to form electrical connection. The second VIAs 32 can be made of Cu, W, Ru, or the like. In some embodiments, a barrier layer (not shown) can be formed between the spacer layers 50 and the first VIAs 32. The barrier layer can be made of Ti, TiN, TaN, Ta, or other suitable materials.

In some embodiments, a plurality of n+ regions can be formed at exposed area of the n-well regions when the n-well regions are exposed by the plurality of VIA openings. The n+ regions can be made by an ion implantation process. When the n+ regions are formed, the spacer layer 50, and the conductive layer can be subsequently deposited in the VIA openings.

Figure 6A:
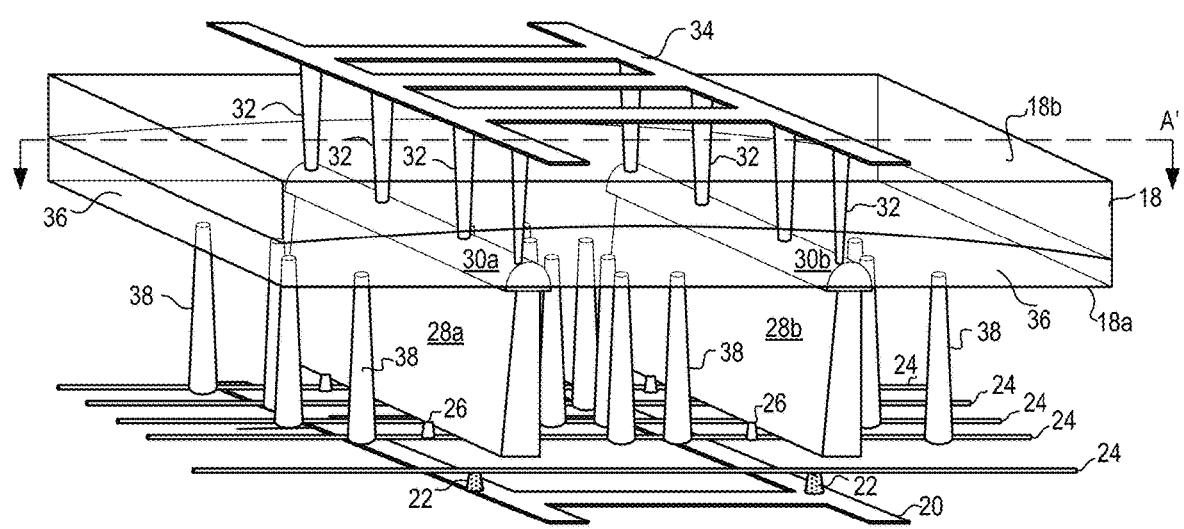
Figure 6B:
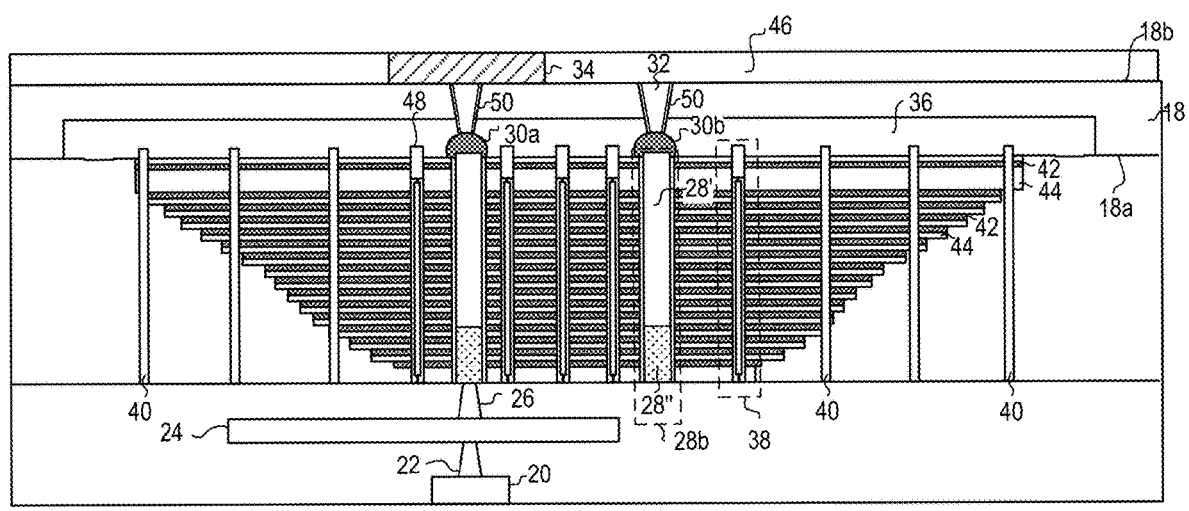

In FIGS. 6A and 6B, the bottom source lines 34 can be formed over the bottom surface 18a of the cell array substrate 18. In some embodiments, before the formation of the source lines 34, a dielectric layer 46, such as SiO, can be formed over the bottom surface 18a. A subsequent photolithography process can be applied to form trench openings in the dielectric layer 46. A film deposition process can then be applied to fill the trench openings with conductive material, such as Cu, Al, W, or the like. A subsequent CMP process can be applied to remove excessive the conduction material over a top surface of the dielectric layer 46. The conductive material that remains in the trench openings form the bottom source lines 34.

Figure 7:
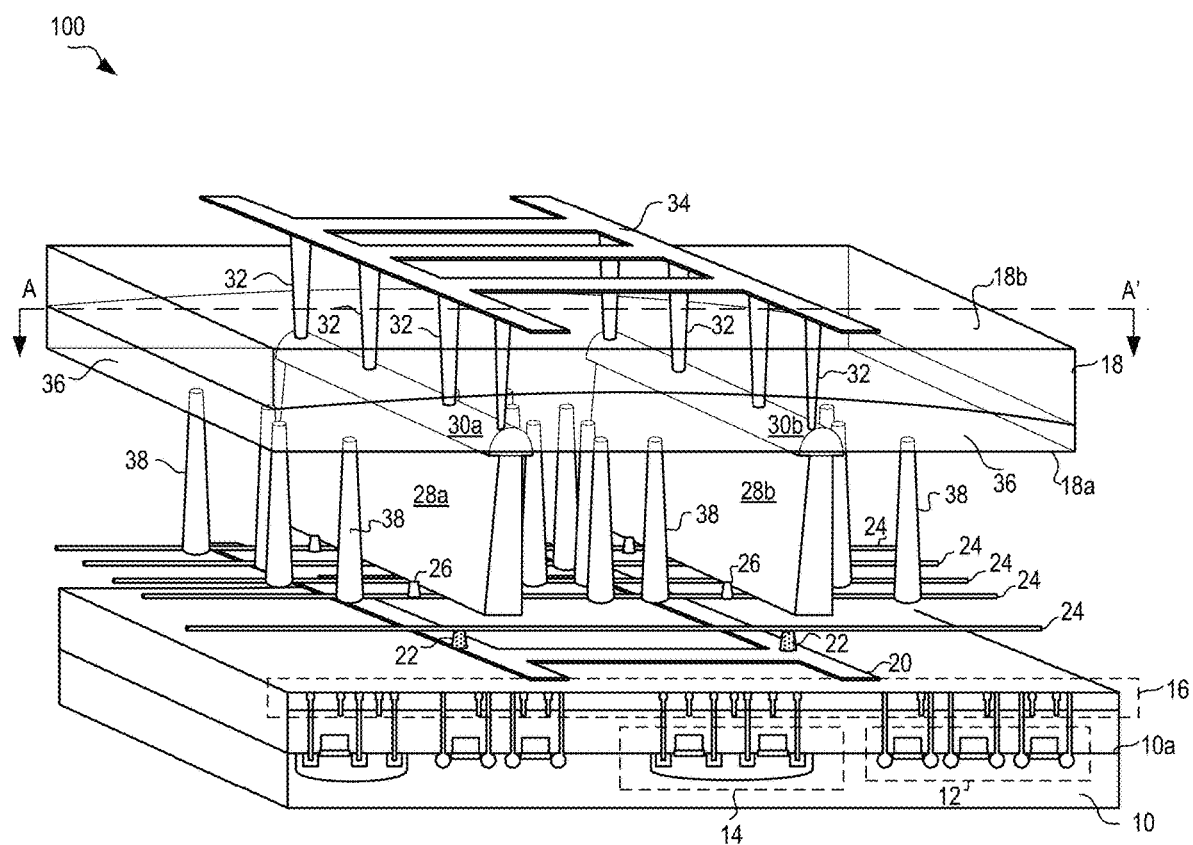

In FIG. 7, the plurality of CMOS transistors, such as PMOS 14 and NMOS 12, can be formed over the top surface 10a of the CMOS substrate 10. The plurality of bonding VIAs 16 can be formed over the CMOS transistors. Subsequently, the cell array substrate 18 and the CMOS substrate 10 can be bonded together through the bonding VIAs 16. The top surface 10a of the CMOS substrate 10 and the top surface 18a of the cell array substrate 18 are aligned facing each other so that the transistors are coupled to the top source lines 20 through the bonding VIAs 16. After manufacturing steps shown in FIG. 7, the 3D-NAND memory device 100 is formed, which has a same configuration as the memory device shown in FIGS. 1A and 1B.

In some embodiments, the fourth VIAs (not shown) are formed over the top source lines 20, and the fourth VIAs are connected to the bonding VIAs 16 so that the cell array substrate 18 and the CMOS substrate 10 are bonded together.

A plurality of TSVs (not shown) can also be formed. The TSVs can extend into the cell array substrate 18 from the bottom surface 18b of the cell array substrate 18, and connect the top source lines 20 and bottom source lines 34.

Figure 8:
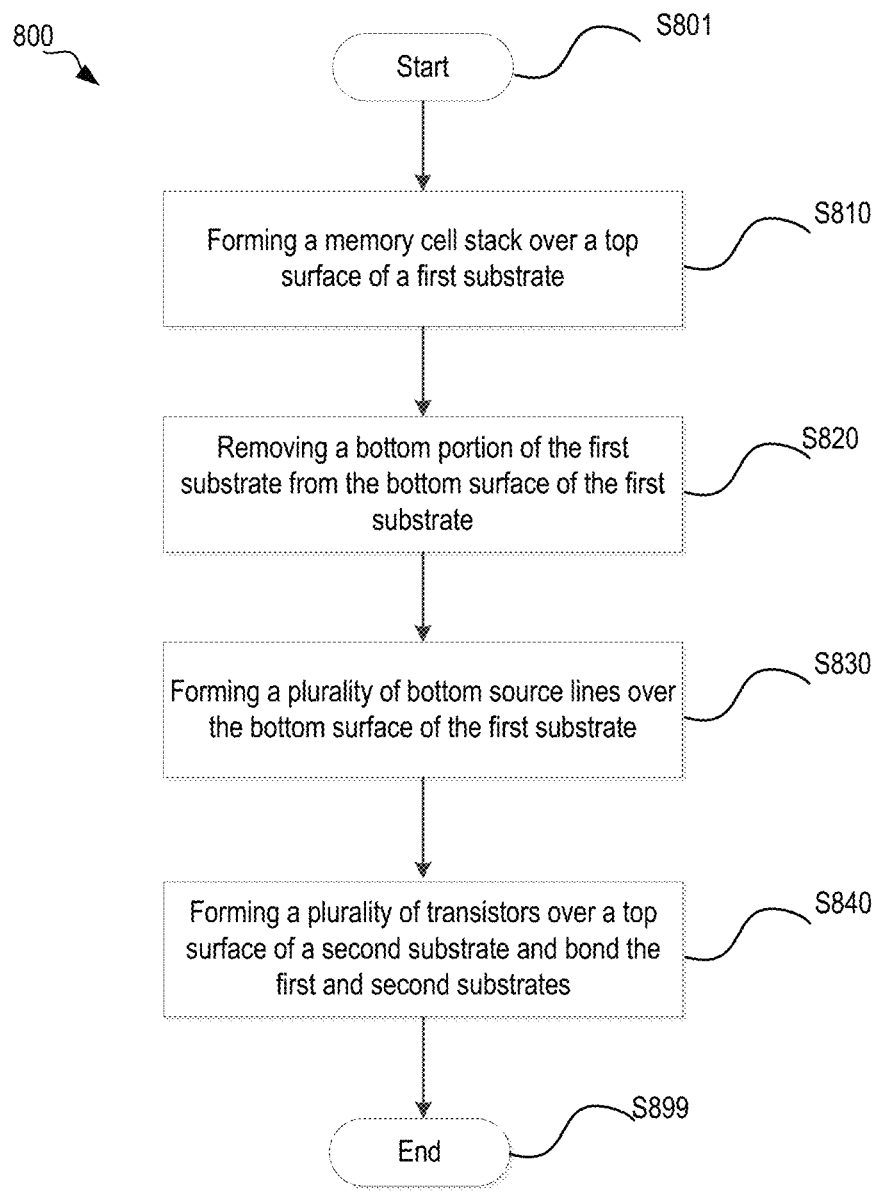
FIG. 8 is a flowchart of an exemplary process for manufacturing a 3D-NAND memory device, in accordance with embodiments of the disclosure.

FIG. 8 is a flowchart of an exemplary process for manufacturing the 3D-NAND memory device 100, in accordance with embodiments of the disclosure. The process 800 begins at step 810 where a memory cell stack can be formed over a top surface of a first substrate. The first substrate further has an opposing bottom surface. The memory cell stack includes two or more n-well regions formed in the first substrate. The two or more n-well regions extend into the first substrate from the top surface. The memory stack can also include two or more ACS structures formed over the two or more n-well regions. Each of the ACS structures is in direct contact with a respective n-well region. In the memory cell stack, a plurality of M1 routing lines are formed over the ACS structures. The M1 routing lines are electrically coupled to the ACS structures through a plurality of M1 VIAs. Further, a plurality of top source lines formed over the plurality of M1 routing lines. The M1 routing lines are electrically coupled to the top source lines through a plurality of M2 VIAs. In some embodiments, step 810 can be performed as illustrated with reference to FIGS. 3A-3B.

The process 800 then proceeds to step 820 where a portion of the first substrate can be removed from the bottom surface of the first substrate. The bottom portion of the first substrate can be removed through an etching process, a CMP process, or the like, or a combination thereof. In some embodiments, step 820 can be performed as illustrated with reference to FIGS. 4A-4B.

In step 830, a plurality of VIA contacts can be formed that extend into the first substrate from the bottom surface to contact the n-well regions. A plurality of bottom source lines can be formed over the VIA contacts. The plurality of bottom source lines are electrically connected to the n-well regions through the VIA contacts. In some embodiments, step 830 can be performed as illustrate with reference to FIGS. 5A-6B.

The process 800 proceeds to step 840 where a plurality of transistors are formed over a top surface of a second substrate, a plurality of bonding VIAs are formed over the transistors. Further, the first substrate and the second substrate are bonded together through the bonding VIAs. The top surface of the first substrate and the top surface of the second substrates are aligned facing each other so that the transistors are coupled to the top source lines through the bonding VIAs. In some embodiments, step 830 can be performed as illustrate with reference to FIG. 7.

It should be noted that additional steps can be provided before, during, and after the process 800, and some of the steps described can be replaced, eliminated, or performed in different order for additional embodiments of the process 800. In subsequent process steps, various additional interconnect structures (e.g., metallization layers having conductive lines and/or VIAs) may be formed over the semiconductor device 100. Such interconnect structures electrically connect the semiconductor device 100 with other contact structures and/or active devices to form functional circuits.

Additional device features such as passivation layers, input/output structures, and the like may also be formed.

The various embodiments described herein offer several advantages over related memory devices. In the related memory devices, an input voltage is applied to a n-well region through a conductive channel that is formed by a source line, a M1 routing line, an ACS structure, and the n-well region. A resistance of the conductive channel is inevitably affected by a resistance of the ACS structure. As a height of a 3D NAND stack increases with density, a height of the ACS region accordingly grows. The resistance of the ACS region inevitably increases in the height direction of the 3D NAND stack. The increased resistance of the ACS region results in an elevated resistance of the conductive channel. The elevated resistance of the conductive channel accordingly can cause ground noise arising in sensing operations of the related memory devices.

In the disclosed memory device, by introducing a cross-point structure, the source lines (or source line mesh) can be electrically coupled to the n-well regions from a polished backside (i.e., the bottom surface) of the cell array substrate. Accordingly, a resistance of source lines to n-well regions can be decreased. The decreased resistance of source lines to n-well regions can reduce the ground noise. In addition, the resistance of the ACS structures does not impact a source side resistance of the memory device and the ground noise. Further, the disclosed structure can eliminate gaps between M1 routing lines that are used to add contacts to connect the source line mesh and the ACS structures, which in turn helps a reduction of die size in a word line direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a first VIA that extends from a second side of a first substrate, wherein the first substrate has an opposing first side on which a memory stack is formed, and the memory stack includes (i) a doped region positioned in the first side of the first substrate and electrically coupled to, (ii) a plurality of word lines formed over the first side of the first substrate in a staircase configuration, and (iii) a plurality of insulating layers that are disposed between the plurality of word lines;
    forming a first connection structure over the first VIA so that the first connection structure is coupled to the doped region through the first VIA;
    forming a common source structure that is coupled to and extends from the doped region, and further extends through the plurality of word lines and the plurality of the insulating layers; and
    forming a transistor that in a first side of a second substrate, wherein the first connection structure is coupled to the transistor.

2. The method of claim 1, wherein the forming the first connection structure over the first VIA further comprises:

removing a portion of the first substrate from the second side of the first substrate;

forming the first VIA that extends from the second side of the first substrate to the doped region; and forming the first connection structure over the first VIA.

3. The method of claim 1, further comprising:

forming a spacer layer between the first VIA and the first substrate to isolate the first VIA from the first substrate.

4. The method of claim 1, further comprising:

forming a n+ region between the first VIA and the doped region, the doped region being n-type.

5. The method of claim 1, wherein the first VIA has at least one of an extended wall-shape that has a tapered cross section or a frustoconical shape.

6. The method of claim 1, further comprising:

forming a bonding VIA over and coupled to the transistor, and bonding the first substrate and the second substrate through the bonding VIA, wherein the first side of the first substrate and the first side of the second substrate are aligned, face each other, and are bonded to each other by the bonding VIA.

7. The method of claim 6, further comprising:

forming a through silicon VIA (TSV) that extends from the second side of the first substrate to the first side of the first substrate so as to be in contact with the bonding VIA, wherein the first connection structure is coupled to the transistor based on the TSV.

8. A semiconductor device, comprising:

a first substrate having a first side for forming memory cells and a second side that is opposite to the first side;

a doped region formed in the first side of the first substrate;

a first connection structure formed over the second side of the first substrate and coupled to the doped region through a first VIA, the first VIA extending from the second side of the first substrate to the doped region; and a transistor formed in a first side of a second substrate and coupled to the first connection structure, wherein the memory cells further include:

a plurality of word lines formed over the first side of the first substrate in a staircase configuration, a plurality of insulating layers that are disposed between the plurality of word lines, a common source structure coupled to and extending from the doped region, and further extending through the plurality of word lines and the plurality of the insulating layers.

9. The semiconductor device of claim 8, further comprising:

a spacer layer disposed between the first VIA and the first substrate that isolates the first VIA from the first substrate.

10. The semiconductor device of claim 8, further comprising:

a n+ region arranged between the first VIA and the doped region, the doped region being n-type.

11. The semiconductor device of claim 8, wherein the first VIA has at least one of an extended wall-shape that has a tapered cross section or a frustoconical shape.

12. The semiconductor device of claim 8, wherein the first VIA extends through the doped region and is further in contact with the common source structure.

13. The semiconductor device of claim 8, further comprising:

a bonding VIA formed over and coupled to the transistor, wherein the first side of the first substrate and the first side of the second substrate are aligned, face each other, and are bonded to each other by the bonding VIA.

14. The semiconductor device of claim 13, furthering comprising:

a through silicon VIA (TSV) that extends from the second side of the first substrate to the first side of the first substrate so as to be in contact with the bonding VIA, wherein the first connection structure is coupled to the transistor based on the TSV.

15. The semiconductor device of claim 8, wherein the common source structure further extends along a direction parallel to the first side of the first substrate.

16. The semiconductor device of claim 15, further comprising:

a plurality of channel structures extending from the first side of the first substrate, wherein:

the plurality of channel structures extend through the plurality of word lines and the plurality of the insulation layers, and the common source structure extends along the direction parallel to the first side of the first substrate to separate the plurality of the channel structures into sub-groups.

\* \* \* \* \*